United States Patent [19]

Takahashi

[11] Patent Number: 4,915,341
[45] Date of Patent: Apr. 10, 1990

[54] FIXATION DEVICE FOR AN ELECTRONIC DISPLAY

[75] Inventor: Katsumasa Takahashi, Nagoya, Japan

[73] Assignee: Kitagawa Industries Co., Ltd., Nagoya, Japan

[21] Appl. No.: 225,200

[22] Filed: Jul. 28, 1988

[30] Foreign Application Priority Data

Oct. 8, 1987 [JP] Japan .................................. 62-154347

[51] Int. Cl.⁴ .............................................. H05K 5/00
[52] U.S. Cl. .................................. 248/500; 248/316.5; 174/138 G; 361/403; 350/334
[58] Field of Search ................. 248/27.1, 220.4, 500, 248/316.5, 316.1; 269/903; 211/41; 368/242; 350/334; 174/138 G; 361/403

[56] References Cited

U.S. PATENT DOCUMENTS

| | | |
|---|---|---|
| 1,091,212 | 3/1914 | Gregory . |
| 1,263,050 | 4/1918 | Fargo . |
| 2,367,458 | 1/1945 | Coplen . |
| 2,541,828 | 2/1951 | Peck . |
| 2,543,881 | 3/1951 | Umphlette et al. . |
| 3,058,714 | 10/1962 | Oliver . |
| 3,080,140 | 3/1963 | Gohs et al. . |
| 3,171,184 | 3/1965 | Wilhelm . |
| 3,501,117 | 3/1970 | Soltysik . |
| 3,713,622 | 1/1973 | Dinger . |
| 3,854,374 | 12/1974 | Boyle et al. . |
| 3,917,202 | 11/1975 | Reinwall, Jr. et al. . |
| 3,922,051 | 11/1975 | Reynolds . |
| 3,931,946 | 1/1976 | Soltysik . |
| 3,963,316 | 6/1976 | Williams . |
| 3,996,500 | 12/1976 | Coules . |
| 4,007,516 | 2/1977 | Coules . |
| 4,012,117 | 3/1977 | Lazzery . |
| 4,030,000 | 6/1977 | Stewart et al. . |
| 4,038,726 | 8/1977 | Takabayashi . |
| 4,139,755 | 2/1979 | Hastings et al. . |
| 4,143,577 | 3/1979 | Eberhardt . |
| 4,176,815 | 12/1979 | Davidson et al. . |
| 4,261,076 | 4/1981 | Clemens . |
| 4,264,047 | 4/1981 | Nelson . |
| 4,356,599 | 11/1982 | Larson et al. . |
| 4,357,061 | 11/1982 | Crosby . |
| 4,417,095 | 11/1983 | Beun . |
| 4,422,728 | 12/1983 | Andreaggi . |
| 4,427,316 | 1/1984 | Moore et al. . |
| 4,457,482 | 7/1984 | Kitagawa . |
| 4,462,621 | 7/1984 | Chapman . |
| 4,467,988 | 8/1984 | Kraus . |
| 4,470,178 | 9/1984 | Matsui . |
| 4,495,548 | 1/1985 | Matsui . |
| 4,504,105 | 3/1985 | Barkus et al. . |
| 4,515,424 | 5/1985 | Sakurai . |
| 4,515,440 | 5/1985 | Mosier . |
| 4,527,312 | 7/1985 | Ruehl et al. . |
| 4,564,163 | 1/1986 | Barnett . |
| 4,618,915 | 10/1986 | Bury . |
| 4,619,431 | 10/1986 | Matsui et al. . |
| 4,650,267 | 3/1987 | Yagi . |
| 4,684,093 | 8/1987 | Yagi . |
| 4,728,753 | 3/1989 | Matsui ............................ 174/138 G |
| 4,813,642 | 3/1988 | Nakano ................................ 248/500 |

FOREIGN PATENT DOCUMENTS

| | | |
|---|---|---|
| 871021 | 2/1953 | Fed. Rep. of Germany . |
| 2135454 | 7/1971 | Fed. Rep. of Germany . |
| 2718442 | 4/1977 | Fed. Rep. of Germany . |
| 101788 | 7/1985 | Japan . |
| 121794 | 7/1986 | Japan . |
| 21585 | 2/1987 | Japan . |
| 1568210 | 5/1980 | United Kingdom . |

*Primary Examiner*—Ramon O. Ramirez
*Assistant Examiner*—Robert A. Olson
*Attorney, Agent, or Firm*—Oliff & Berridge

[57] ABSTRACT

A fixation device (1) for an electronic display (2) which includes a pair of holding members (5a, 5b) provided at the opposite transverse edges of a plate-like rest (3) for holding the electronic display (2) at the predetermined position on the rest (3). The holding members (5a, 5b) include holding plates (21a, 21b) having triangle-like portions (21a', 21b') at the end near hinges (4a, 4b) respectively. Thereby, the swinging angle of the holding members (5a, 5b) can be slight when retaining and releasing of the electronic display (2).

9 Claims, 8 Drawing Sheets

FIXATION DEVICE FOR AN ELECTRONIC DISPLAY

BACKGROUND OF THE INVENTION

1. Technical Field

The present invention relates to a fixation device for an electronic display, particularly to a device for fixing an electronic display on a printed circuit board of electronic apparatuses with high stability by a simple attaching operation.

2. Prior Art

An electronic display such as a liquid-crystal or fluorescent display tube for digitally or graphically showing a volume of sound, frequency, revolution speed, time measurement result or the like is attached to a home electric appliances such as a television set, a radio, a video tape recorder, a microwave oven, a stereo, and a measuring instrument.

Figure 12:
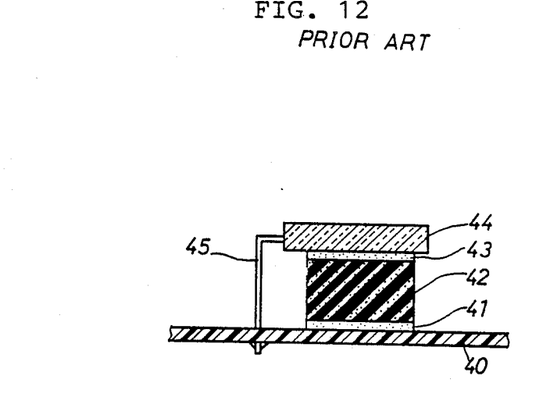
FIG. 12 is a schematic sectional view showing a conventional fixing method.

Various methods for mounting such electronic displays into electric appliances have been proposed. For example, FIG. 12 is a schematic sectional view showing an example of a conventional mounting method, in which a double-coated tape or adhesive 41 is adhered onto a circuit board 40, then a buffer material 42 such as, for example, a sponge made of chloroprene is stuck onto the tape or adhesive 41, further, a double coated tape or adhesive 43 is adhered to the buffer material 42, and the back of an electronic display 44 is fixed adhesively to the tape or adhesive 43, while terminals 45 extending from the electronic display 44 are inserted into through holes formed in the circuit board 40 to support the electronic display 44.

In such fixing method, however, the application of the adhesive and the removal of a release paper from the double-coated tape are troublesome, and particularly when an adhesive is used, its drying takes time. Further, it is difficult to dispose the electronic display 44 in a predetermined position. The display 44 is apt to be dislocated, and its terminals 45 are easily bent under a one-sided load imposed thereon, and so are difficult to be inserted into the through holes formed in the circuit board 40. Also for maintenance, various drawbacks are involved in such fixing method, for example, the electronic display 44 once mounted is difficult to remove, and the height is not stabilized.

Various fixation devices for installing electronic display parts into electronic apparatuses have been proposed. For example, in the U.S. Pat. No. 4,684,093, some fixation devices are described.

Those fixation devices described in U.S. Pat. No. 4,684,093 are shown in FIGS. 13 through 15 and FIG. 16 attached herewith.

In the prior art, fixation devices 50 and 150 comprise at least two holding members 52 and 152 formed at corners of a plate-like rest 51 and 151 so as to pivot via hinges 54 and 154 for retaining an electronic display 55. Engaging members 59 and 159 are formed at the other corner of the rest 51 and 151 as opposed to the hinges 54 and 154 for engaging each free end of the holding members 52 and 152 at the position where the above mentioned electronic display 55 is retained by the holding members 52 and 152. Fixing members 56a extend from the back surface of the plate-like rest 51 and 151 for fixing the rest 51 and 151 on a circuit board 57.

Figure 13:
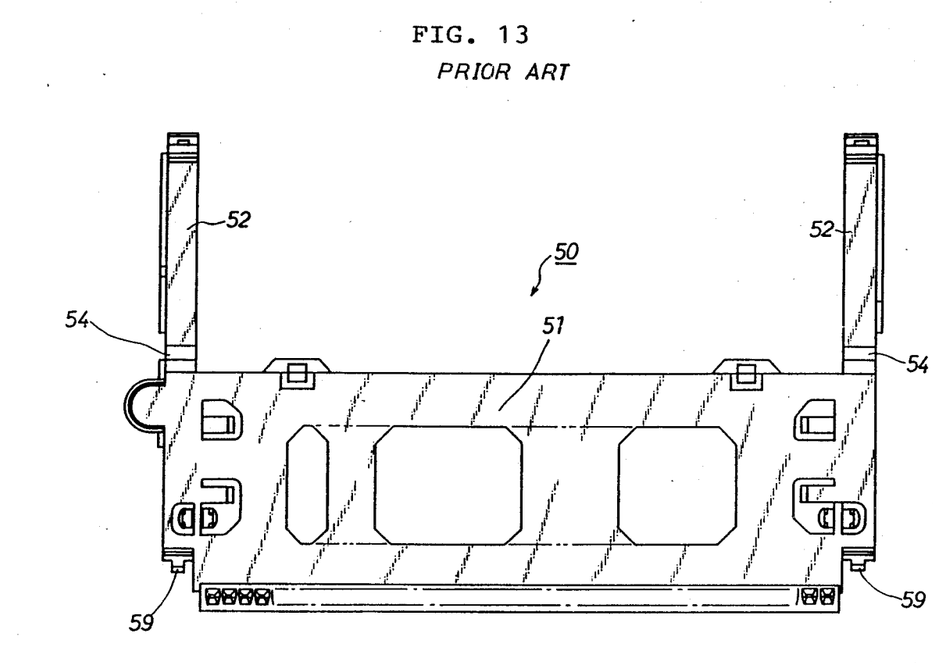
FIGS. 13 through 15 are respectively illustrative of a plan view, a side view, and a side view showing a state of use of the prior art.
Figure 14:
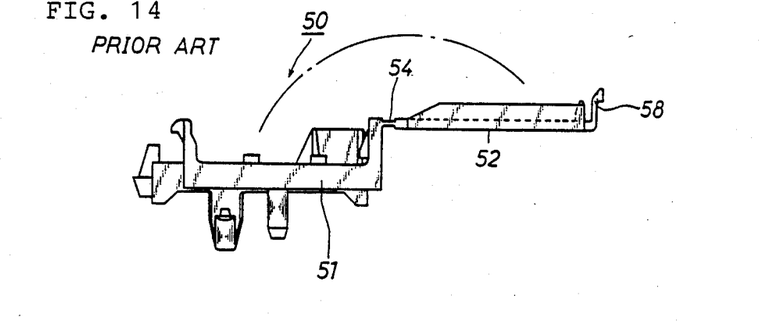
Figure 15:
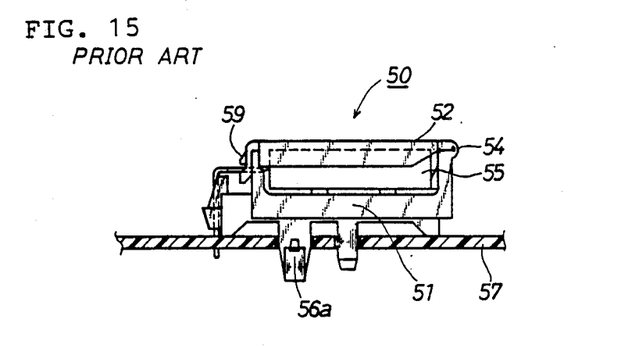
Figure 16:
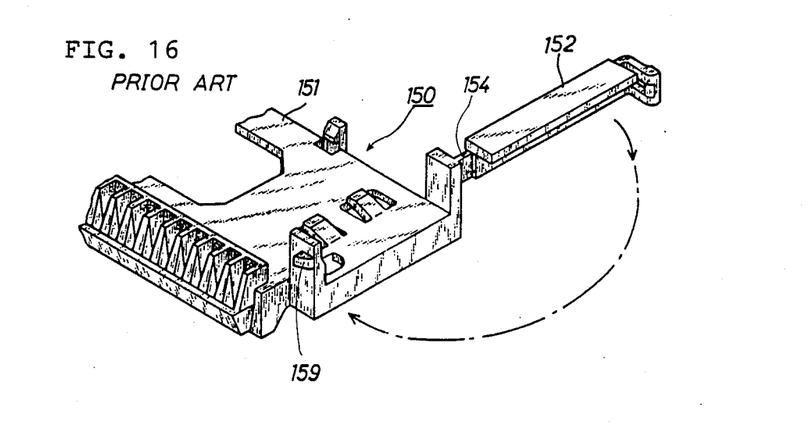
FIG. 16 is a partial view in perspective of a fixation device of another prior art.

However, the above mentioned fixation devices 50 and 150 have the following problems. (1) The holding members 52 and 152 have to greatly pivot at large angles, which is from 90 to 180 degrees, via hinges 54 and 154 when attaching and demounting of the electronic display 55. (2) An extra space around the fixation device 50 and 150 has to be reserved when the holding members 52 and 152 are pivotably turned at large angles without difficulties. (3) Durability of the hinges 54 and 154 is rather poor because of the hard activities imposed upon the hinges 54 and 154 at the time of pivoting. (4) The hinges 54 and 154 tend to become damaged when the holding members 52 and 152 are engaged for a long time for transportation. (5) In order to avoid the preceding problems packaging efficiency is lowered because the holding members 52 and 152 should be completely opened, as shown in FIGS. 13 and 16.

SUMMARY OF THE INVENTION

The first object of the present invention is to provide a fixation device which does not require a large pivoting space of holding members when attaching and demounting of an electronic display.

The second object of the present invention is to provide a fixation device which is structured in respect to improve the durability of the hinges against the pivoting activities of the holding members.

The third object of the present invention is to provide a fixation device which is capable of compact packaging, less damageable during transportation, compact in size, and reliable in quality.

The present invention is to achieve the abovementioned objects, and is employed in the following structures.

A fixation device 1 for an electronic display 2 comprises a rectangular flat plate-like rest 3 on which the electronic display 2 is mounted; a pair of hinges 4a and 4b provided on opposite ends of the rest 3; a pair of holding members 5a and 5b each connected to one of the hinges 4a and 4b for swinging horizontally; and a pair of holding plates 21a and 21b each provided to one of the holding members 5a and 5b for holding an upper surface 33 of the electronic display 2, wherein the breadth of the holding plates 21a and 21b are diminishing toward the hinges 4a and 4b.

DESCRIPTION OF A PREFERRED EMBODIMENT

An embodiment of the present invention is described hereinafter with reference to the accompanying drawings.

A fixation device 1 for an electronic display 2 comprises a rectangular flat plate-like rest 3, hinges 4a and 4b, and holding members 5a and 5b.

Figure 1:
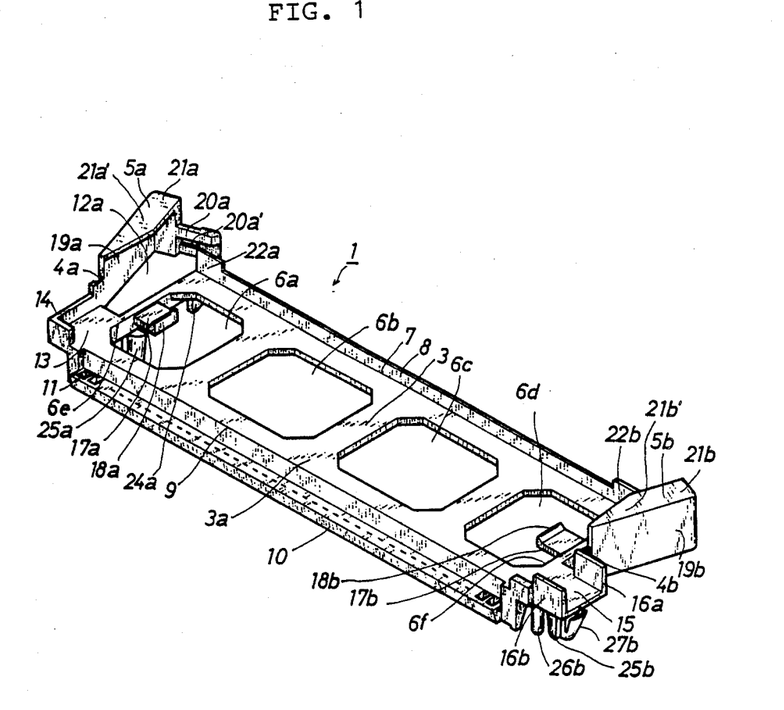
FIG. 1 is a perspective view of a fixation device of the present embodiment.
Figure 2:
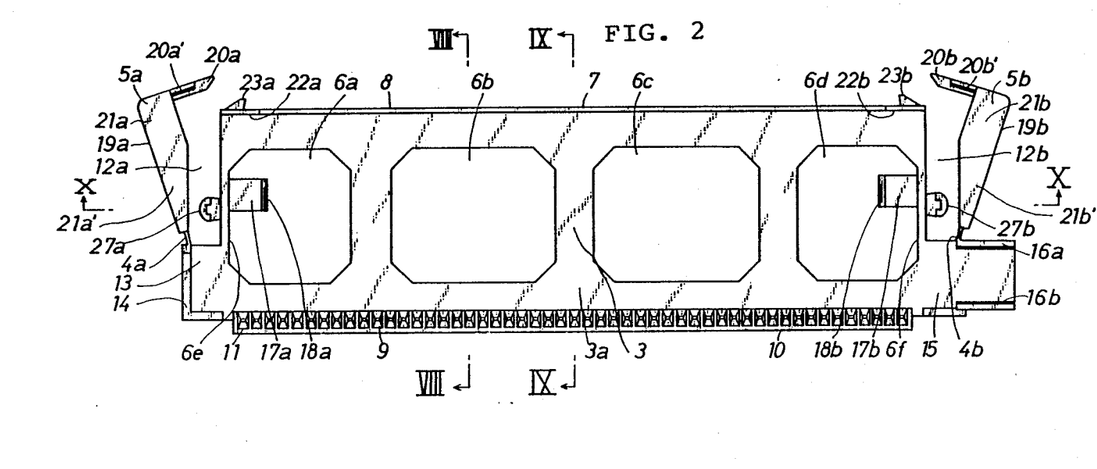
FIG. 2 is a plan view thereof.
Figure 3:
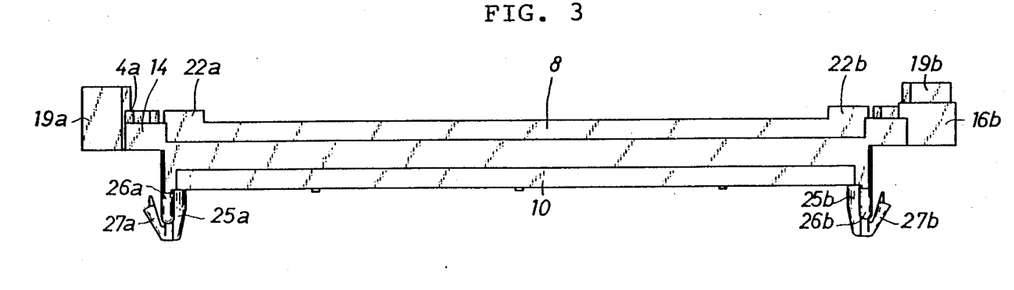
FIG. 3 is a front view thereof.
Figure 11:
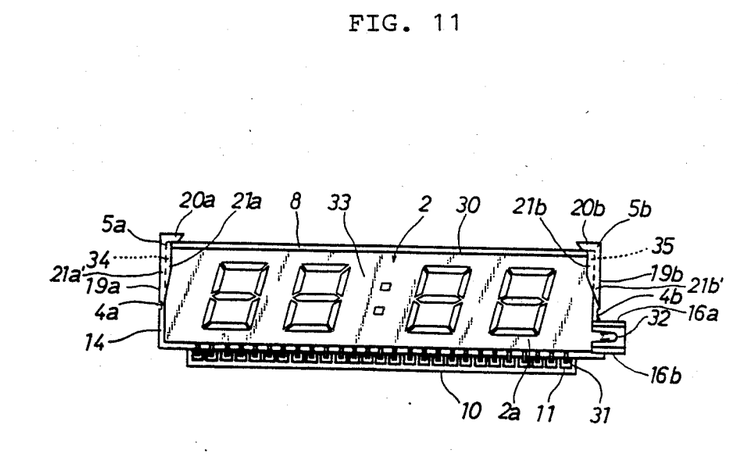
FIG. 11 is a plan view showing a state of use.

The rest 3 has four openings 6a, 6b, 6c, and 6d, as shown in FIGS. 1 and 2, which are maintenance openings for other electronic devices set under the fixation device 1 and they are for reducing the weight of the fixation device 1. A stopper 8 is provided along a longitudinal edge 7 of the rest 3. Thereby, as clearly shown in FIG. 11, any movement of the electronic display 2 is prevented. A terminal holding frame 10 is provided downwardly along the other longitudinal edge 9 of the rest 3. A number of frustum-shaped guide grooves 11, as shown in FIGS. 1 and 2, are formed in series along the longitudinal edge 9 in the terminal holding frame 10. The guide grooves 11 are to hold terminals 31 of the electronic display 2, as shown in FIG. 11. The electronic display 2 is set at the predetermined position on an upper surface 3a of the rest 3 by inserting the terminals 31 to the guide grooves 11. Rectangle-shaped lacking areas 12a and 12b, as clearly shown in FIG. 2, are respectively provided at ends of the longitudinal edge 7 of the rest 3. Moreover, an L-shaped corner frame 14 is provided at a left end 13 of the longitudinal edge 9. The corner frame 14 is to prevent the electronic display 2 from slipping off the rest 3. A pair of protector plates 16a and 16b, which are paralleled to each other, and are respectively provided at a right end 15 of the longitudinal edge 9. The function of the protector plates 16a and 16b is to protect a glass projection 32, as shown in FIG. 11, which are extended from the electronic display 2 for charging of gas into a display tube 2a. Also, a pair of spring members 17a and 17b, as shown in FIGS. 1 and 2, are respectively formed at transverse outer side edges 6e and 6f of the openings 6a and 6b, wherein push projections 18a and 18b are respectively provided at ends of the spring members 17a and 17b. The function of the push projections 18a and 18b is to push the electronic display 2 up to the holding members 5a and 5b to secure the electronic display 2.

Figure 4:
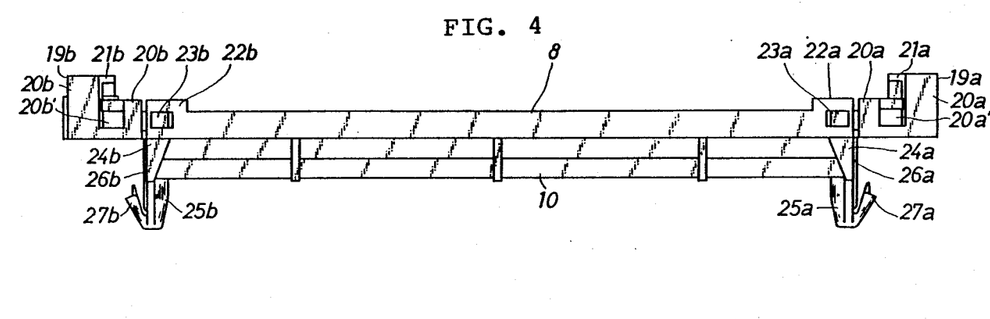
FIG. 4 is a rear view thereof.
Figure 5:
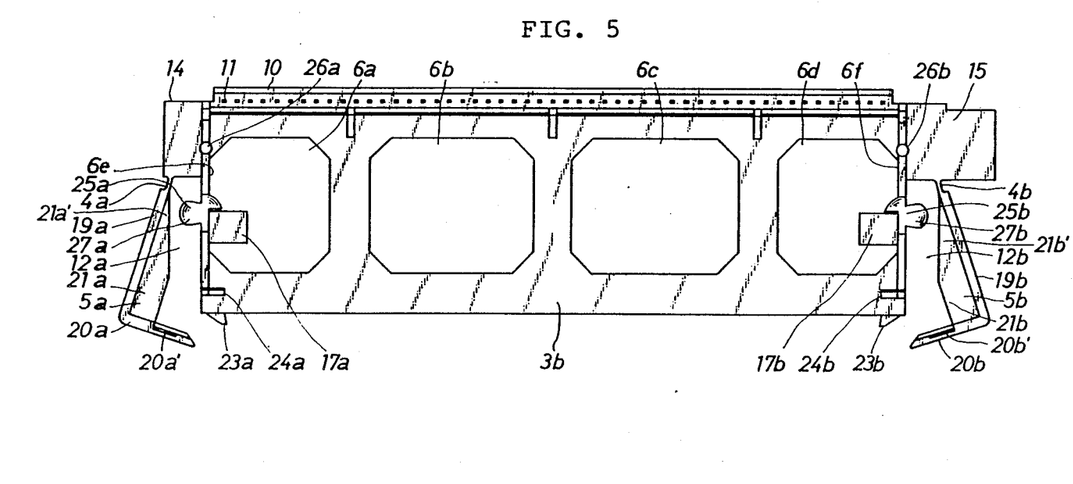
FIG. 5 is a bottom view thereof.

Next, the holding members 5a and 5b are explained hereinafter. The holding members 5a and 5b, as shown in FIG. 2, are respectively connected with the corner frame 14 and left side of the protector plate 16a, whereby the holding members 5a and 5b are pivotably turned via the hinges 4a and 4b. The holding members 5a and 5b, as shown in FIGS. 1, 2, and 5 are composed of side frames 19a and 19b, engaging members 20a and 20b, and holding plates 21a and 21b. The side frames 19a and 19b are formed so as to vertically stand against the upper surface 3a. The engaging members 20a and 20b are integrally formed with the side frames 19a and 19b so as to project therefrom at right angles in a direction toward the center of the rest 3. Moreover, the holding plates 21a and 21b are integrally formed with upper ends of the side frames 19a and 19b, and the engaging members 20a and 20b as bracket members which are paralleled to the upper surface 3a. The holding plates 21a and 21b, as shown in FIG. 2, have triangle-like portions 21a' and 21b', whereby the breadth of the holding plates 21a and 21b diminishes toward the hinges 4a and 4b. The engaging openings 20a' and 20b' are provided in the engaging members 20a and 20b. A pair of engaging plates 22a and 22b are respectively provided at transverse ends of the stopper frame 8, wherein the height of the plates 22a and 22b is greater than that of the frame 8, as clearly shown in FIG. 1. Engaging projections 23a and 23b, as shown in FIGS. 2 and 4, are respectively provided on the engaging plates 22a and 22b. The engaging projections 23a and 23b are to hold the holding members 5a and 5b at a predetermined position by engaging with the openings 20a' and 20b'.

Hereinabove, when the holding members 5a and 5b are engaged, the holding plates 21a and 21b are attached to a display surface 33 of the electronic display 2 which is pushed up by the spring members 17a and 17b through the push projections 18a and 18b. Namely, the electronic display 2 is retained between the holding plates 21a, 21b and the push projections 18a, 18b.

Secondly, the hinges 4a and 4b are explained with reference to FIGS. 1 and 2.

The hinge 4a is a film-like hinge which is vertically provided against the upper surface 3a, and is integrally formed with the side frame 19a and the corner frame 14. Similarly, the hinge 4b is integrally formed with the side frame 19b and the protector plate 16a, further, the hinges 4a and 4b possess resilient quality. Therefore, the holding plates 21a and 21b are moved in parallel to the rest 3 when the holding members 5a and 5b are pivotably turned via the hinges 4a and 4b.

As shown in FIG. 11, the hinges 4a and 4b are formed so as to be straight with the side frames 19a and 19b when the holding members 5a and 5b are engaged. Namely, the hinges 4a and 4b are structured not to bend when the electronic display 2 is retained by the fixation device 1.

The supporting members 25a and 25b are described hereinafter with reference to FIGS. 1 through 7.

Figure 6:
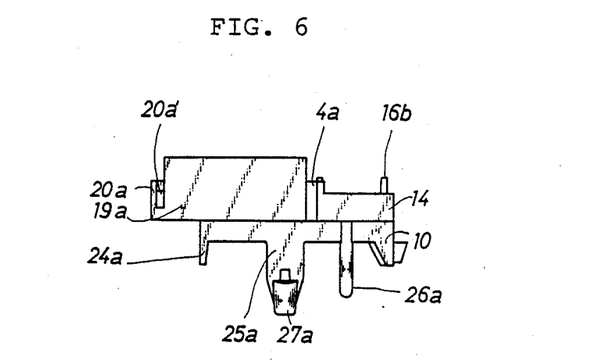
FIG. 6 is a left-hand side view thereof.
Figure 7:
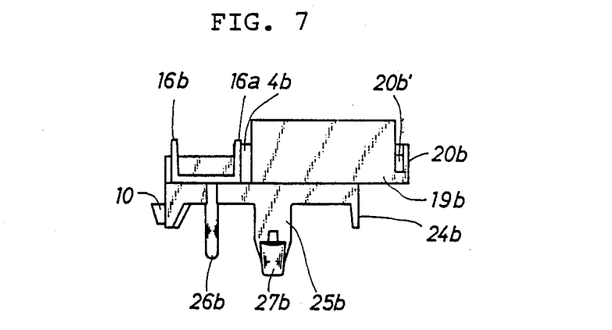
FIG. 7 is a right-hand side view thereof.
Figure 8:
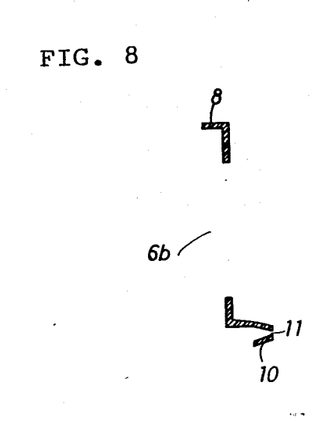
FIGS. 8 through 10 are sectional views respectively on the line VIII—VIII, the line IX—IX, and the line X—X in FIG. 2.
Figure 9:
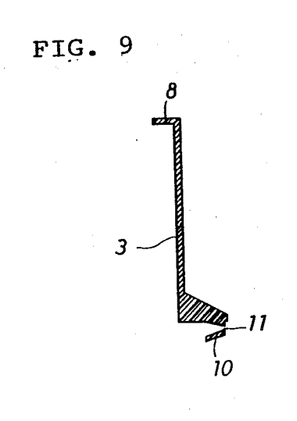
Figure 10:
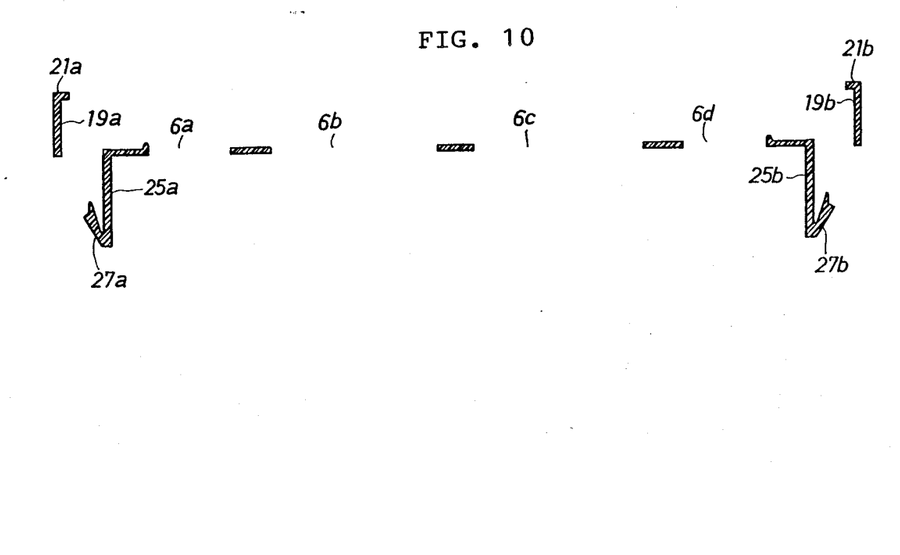

The supporting members 25a and 25b are vertically extended from a lower surface 3b of the rest 3, which are very near the spring members 17a and 17b. The supporting legs 26a and 26b, as clearly shown in FIGS. 6 and 7, are provided beside the supporting members 25a and 25b, which are equally extended from the back of the rest 3. The supporting legs 26a and 26b, as clearly recognized, are slightly shorter than the supporting members 25a and 25b, and function as supplemental supporting members. Also, at the end of the supporting members 25a and 25b, locking pieces 27a and 27b are formed, which are to stabilize the fixation device 1 when inserted into designated holes of a print circuit board (not shown). Furthermore, spacers 24a and 24b are provided at the lower surface 3b of the rest 3. The spacers 24a and 24b are to separate the rest 3 from the print circuit board with a preset distance.

The procedures for attaching and demounting of the electronic display 2 are explained hereinafter.

First, as shown in the FIG. 11, the terminals 31 are inserted into the guide grooves 11 of the terminal holding frame 10, and the electronic display 2 is mounted on the upper surface 3a of the rest 3. Secondly, the longitudinal edge 30 of the electronic display 2 is attached or closely contacted to the stopper frame 8, thus, the electronic display 2 is located at the preset position on the rest 3. The corner frame 14 functions not only to prevent the terminals 31 from bending by unexpected movements of the electronic display 2, but also to prevent the loose attachment of the electronic display on the rest 3. Then, the electronic display 2 is pushed down against the pressure from the spring members 17a and 17b. Next, the holding members 5a and 5b are moved slightly toward the electronic display 2. Consequently, the holding plates 21a and 21b, which are in parallel to the rest 3, are moved over corner edges 34 and 35 of the electronic display 2, as shown in FIG. 11. Simultaneously, the engaging members 20a and 20b are engaged with the engaging projections 23a and 23b on the engaging plates 22a and 22b. Further, when the downward pressure of the electronic display 2 is released, the electronic display 2 is pushed up by the spring members 17a and 17b. Therefore, the display surface 33 of the electronic display 2 is attached to the holding plates 21a and 21b. Finally, the electronic display 2 is fixed between the holding plates 21a and 21b, and the spring members 17a and 17b. Conclusively, through the above procedures, the display surface 33 of the electronic display 2 is positioned at a preset height of the rest 3. The stopper frame 8, the corner frame 14, the protection plates 16a and 16b, and the side frames 19a and 19b function to prevent the electronic display 2 from slipping off the rest 3 and to prevent the inclined setting of the electronic display 2.

Next, the supporting members 25a and 25b and the supporting legs 26a and 26b are respectively inserted to designated holes in a printed circuit board (not shown). Consequently, the supporting members 25a and 25b are engaged to the print circuit board by the locking pieces 27a and 27b. Thereby, the fixation device 1 is fixed at the predetermined position on the printed circuit board by means of the supporting members 25a and 25b and the supporting legs 26a and 26b. Furthermore, the spacers 24a and 24b support the rest 3 in parallel to the printed circuit board with a fixed distance therebetween when the spacers 24a and 24b abut against the printed circuit board. Finally, the fixation device 1 with the electronic display 2 mounted thereon is precisely and securely set on the printed circuit board.

As shown in FIGS. 2 and 5, the holding members 5a and 5b expand at a very small degree when they are opened. Therefore, the space for the pivoting activities of the holding members 5a and 5b can be so slight even when the electronic display 2 is mounted on the fixation device 1 which is already set on the printed circuit board.

Moreover, when the electronic display 2 is pressed downward at the lacking portions 12a' and 12b', the corner edges 34 and 35 of the electronic display 2 can bend below the upper surface 3a. As a result, the holding members 5a and 5b can be swung without difficulties over the corner edges 34 and 35.

All of the abovementioned members of the fixation device 1 are integrally formed by any type of plastic such as a polyamide condensation polymer or a polyester condensation polymer.

Obviously, many modifications and variations of the present invention are possible in the light of above teachings. It is therefore to be understood that within the scope of the appended claims, the invention may be practiced otherwise than as specifically described.

What is claimed is:

1. A fixation device for an electronic display, comprising:
   a rectangular flat plate-like rest for supporting a lower surface of the electronic display said rest having front and back surfaces and two opposed sides;
   a pair of holding members, each holding member provided along a respective, opposite side of the rest, each holding member having a side frame;
   a pair of hinges, each hinge provided on a respective, opposite side of the rest and connected to an end of the side frame of the holding member provided along that respective side of the rest, for swinging the holding member horizontally; and
   a pair of holding plates, a holding plate provided on an upper surface of each side frame of the holding members, for holding an upper surface of the electronic display, wherein the holding plates project from the side frames toward the rest and the width of each holding plate diminishes toward its respective hinge and the length of each holding member is less than the width of the rest.

2. A fixation device according to claim 1, wherein each of the holding plates comprises a triangular portion at the end near the hinges.

3. A fixation device according to claim 1, wherein the device is of one-piece construction and each hinge and connected side frame of each holding member extends in a substantially straight line along the opposite sides of the rest when the holding members are at a position for holding the display.

4. A fixation device according to claim 3, wherein the hinges are respectively attached near the center of the opposite sides of the rest.

5. A fixation device according to claim 1, wherein the device comprises a terminal holding frame (9) provided on a longitudinal end of the rest (31) for holding terminals projecting from the electronic display and for positioning the electronic display at a predetermined position on the rest.

6. A fixation device according to claim 1, wherein the device comprises limiter frames provided on the periphery of the rest for limiting the horizontal movement of the electronic display.

7. A fixation device according to claim 1, wherein the device comprises a pair of spring members provided on the rest for pushing up the electronic display from the rest.

8. A fixation device according to claim 1, wherein the device comprises supporting members provided on a lower surface of the rest for supporting the device on a printed circuit board and further comprises spacers provided on the lower surface for dislocating the device from the printed circuit board by a predetermined distance when supported by the supporting members.

9. A fixation device according to claim 1, wherein the device comprises lacking portions provided between each holding member and each respective, opposite side of the rest for deflecting corners of the electronic display below an upper surface of the rest in order to smoothly swing the holding members when attaching and demounting the display on the rest.

* * * * *